(12) United States Patent
Kang et al.

(10) Patent No.: US 9,136,414 B2
(45) Date of Patent: Sep. 15, 2015

(54) BACK SHEET FOR A SOLAR CELL MODULE, AND SOLAR CELL MODULE COMPRISING SAME

(75) Inventors: Han Jun Kang, Suwon-si (KR); Sung Ho Lee, Ansan-si (KR); Jin Ho Kim, Anyang-si (KR)

(73) Assignee: Youl Chon Chemical Co., LTD., Seoul (KR)

( * ) Notice: Subject to any disclaimer, the term of this patent is extended or adjusted under 35 U.S.C. 154(b) by 0 days.

(21) Appl. No.: 14/116,624

(22) PCT Filed: May 17, 2012

(86) PCT No.: PCT/KR2012/003894
§ 371 (c)(1),
(2), (4) Date: Nov. 8, 2013

(87) PCT Pub. No.: WO2012/157975
PCT Pub. Date: Nov. 22, 2012

(65) Prior Publication Data
US 2014/0090708 A1  Apr. 3, 2014

(30) Foreign Application Priority Data

May 17, 2011 (KR) .................. 10-2011-0046450
May 16, 2012 (KR) .................. 10-2012-0052091

(51) Int. Cl.
*H01L 31/00* (2006.01)
*H01L 31/048* (2014.01)
(Continued)

(52) U.S. Cl.
CPC .......... *H01L 31/0487* (2013.01); *B32B 15/085* (2013.01); *B32B 15/20* (2013.01); *B32B 27/20* (2013.01); *H01L 31/049* (2014.12);
(Continued)

(58) Field of Classification Search
CPC combination set(s) only.
See application file for complete search history.

(56) References Cited

U.S. PATENT DOCUMENTS 6,005,184 A * 12/1999 Barnes .......................... 136/246
6,018,123 A *  1/2000 Takada et al. ................. 136/248
(Continued)

FOREIGN PATENT DOCUMENTS

EP    2372782 A1   10/2011
EP    2535947 A1   12/2012
(Continued)

OTHER PUBLICATIONS

Japanese Patent Office, Communication dated Sep. 9, 2014, issued in corresponding Japanese Application No. 2014511300.
(Continued)

*Primary Examiner* — Eli Mekhlin
(74) *Attorney, Agent, or Firm* — Sughrue Mion, PLLC

(57) ABSTRACT

Provided are a back sheet for a solar cell module, and a solar cell module comprising same. The back sheet for a solar cell module comprises: a heat-dissipating metal layer; an upper anticorrosion layer formed on the upper surface of said heat-dissipating metal layer; a lower anticorrosion layer formed on the lower surface of said heat-dissipating metal layer; and a surface layer formed on said upper anticorrosion layer and adhered to a charging sheet of the solar cell module. The back sheet for a solar cell module according to the present invention has superior heat-dissipating properties and thus may efficiently dissipate (discharge) heat generated in a solar cell, thereby increasing the amount of power generation (photo-conversion efficiency) of the solar cell. In addition, the back sheet of the present invention is inexpensive and may improve adhesive force and the like.

20 Claims, 6 Drawing Sheets

(51) Int. Cl.
 *H01L 31/049* (2014.01)
 *H01L 31/054* (2014.01)
 *B32B 15/085* (2006.01)
 *B32B 15/20* (2006.01)
 *B32B 27/20* (2006.01)

(52) U.S. Cl.
 CPC ......... *H01L31/0547* (2014.12); *B32B 2255/06* (2013.01); *B32B 2264/102* (2013.01); *B32B 2457/12* (2013.01); *Y02E 10/52* (2013.01)

(56) References Cited

U.S. PATENT DOCUMENTS

| | | | |
|---|---|---|---|
| 6,407,329 B1 * | 6/2002 | Iino et al. | 136/251 |
| 2002/0182397 A1 * | 12/2002 | Whatley | 428/297.4 |
| 2008/0023064 A1 * | 1/2008 | Hayes et al. | 136/251 |
| 2008/0216889 A1 * | 9/2008 | Blong et al. | 136/251 |
| 2009/0139564 A1 | 6/2009 | Miyaji et al. | |
| 2009/0242026 A1 | 10/2009 | Miyaji et al. | |
| 2010/0229918 A1 * | 9/2010 | Okamoto et al. | 136/244 |
| 2010/0288342 A1 * | 11/2010 | Wu | 136/252 |
| 2011/0073169 A1 | 3/2011 | Iwanaga | |
| 2011/0100425 A1 | 5/2011 | Osamura et al. | |
| 2011/0265854 A1 * | 11/2011 | Young | 136/246 |
| 2012/0067399 A1 | 3/2012 | Park et al. | |
| 2012/0111392 A1 | 5/2012 | Takanashi et al. | |
| 2012/0167981 A1 | 7/2012 | Yamaguchi et al. | |
| 2012/0208943 A1 * | 8/2012 | Kojima et al. | 524/417 |
| 2013/0269776 A1 * | 10/2013 | Wu et al. | 136/256 |

FOREIGN PATENT DOCUMENTS

| | | | |
|---|---|---|---|
| JP | 2000114565 A | | 4/2000 |
| JP | 2005-123452 A | | 5/2005 |
| JP | 2005-129728 A | | 5/2005 |
| JP | 2009188299 A | | 8/2009 |
| JP | 2009248377 A | | 10/2009 |
| JP | 2011006659 A | | 1/2011 |
| JP | 2011-96989 A | | 5/2011 |
| KR | 10-2008-0053469 A | | 6/2008 |
| KR | 10-2009-0049586 A | | 5/2009 |
| KR | 10-2011-0035936 A | | 4/2011 |
| WO | 2010073735 A1 | | 7/2010 |
| WO | 2010/116649 A1 | | 10/2010 |
| WO | 2010/132638 A1 | | 11/2010 |
| WO | 2010143816 A2 | | 12/2010 |
| WO | 2011/034070 A1 | | 3/2011 |
| WO | WO 2011052290 A1 * | | 5/2011 |

OTHER PUBLICATIONS

European Patent Office, communication dated Mar. 16, 2015 in counterpart European Application No. 12786426.2.

* cited by examiner

-Prior Art-

BACK SHEET FOR A SOLAR CELL MODULE, AND SOLAR CELL MODULE COMPRISING SAME

CROSS REFERENCE TO RELATED APPLICATIONS

This application is a National Stage of International Application No. PCT/KR2012/003894, filed on May 17, 2012, which claims priority from Korean Patent Application Nos. 10-2011-0046450, filed on May 17, 2011, and 10-2012-0052091, filed on May 16, 2012, the contents of all of which are incorporated herein by reference in their entirety.

TECHNICAL FIELD

The present disclosure relates to a back sheet for a solar cell module and a solar cell module including same. More specifically, it relates to a back sheet for a solar cell module that can improve power generation of a solar cell because of superior heat-dissipating property, can be supplied at low cost and has superior adhesive force, etc. and a solar cell module including same.

BACKGROUND ART

Recently, solar cells developed as next-generation energy source are being rapidly spread for household and industrial purposes.

In general, a solar cell module includes a plurality of solar cells. The solar cells are filled in a filling sheet and fixed by the filling sheet and a back sheet is attached at least on a lower surface for the purpose of sealing, and thereby the solar cell module is prepared. FIG. 1 schematically shows the configuration of an existing general solar cell module.

Referring to FIG. 1, a solar cell module generally has a structure wherein a reinforced glass 3 onto which light is incident, an upper filling sheet 2a, solar cells C, a lower filling sheet 2b and a back sheet 1 are stacked sequentially. Between the upper filling sheet 2a and the lower filling sheet 2b, the plurality of solar cells C are filled and fixed while connected electrically. As for the upper/lower filling sheet 2a, 2b, an ethylene vinyl acetate (EVA) sheet which is advantageous in fixing the solar cells C is used. The back sheet 1 is bonded to the filling sheet 2b and protects the solar cells C.

A long lifetime with no deterioration of output over a long period of time is required for a solar cell module. To ensure the long lifetime, it is important to isolate moisture or oxygen that may negatively affects the solar cell C and to prevent deterioration of the back sheet 1 due to UV, etc. Also, low cost of the back sheet 1 is strongly demanded by consumers recently. Accordingly, the back sheet 1 has to be made of a material with good heat resistance, durability, weather resistance, etc. so that it can endure high temperature, humidity, UV, etc. well in order to ensure long lifetime of the solar cell module, and needs to be available at low cost.

The back sheet 1 for a solar cell module generally has a structure in which a heat-resistant polyethylene terephthalate (PET) film as a base film is stacked with a weather-resistant fluorine-based film. That is to say, as shown in FIG. 1, the back sheet 1 generally includes a PET film 1a and a fluorine-based film 1b formed on the PET film 1a. The fluorine-based film 1b is attached to upper and lower surfaces of the PET film 1a by an adhesive.

The PET film 1a is useful as a base film of the back sheet 1 because it is superior not only in heat resistance but also in durability including mechanical strength. A polyvinylidene fluoride (PVDF, Polyvinylidene fluoride) film is frequently used as the fluorine-based film 1b. The PVDF film exhibits excellence weather resistance, etc.

Heat is generated when the solar cell is operated. The generated heat needs to be dissipated (discharged) to outside as much as possible to ensure good power generation (i.e., photoconversion efficiency) of the solar cell. Although the existing back sheet 1 is superior in heat resistance, durability, weather resistance, etc., power generation (photoconversion efficiency) of the solar cell needs to be improved because it has no or unsatisfactory heat-dissipating property of dissipating the heat generated in the solar cell.

Also, as described above, the existing back sheet 1 is prepared by attaching the fluorine-based PVDF film 1b on the PET film 1a using an adhesive to improve weather resistance, etc. However, because the PVDF film 1b is expensive, it is not easy to lower the cost of the back sheet 1.

In addition, the back sheet 1 needs to be firmly attached to the lower filling sheet 2b, i.e. the EVA sheet, of the solar cell module to ensure sealing. However, the existing back sheet 1 is problematic in that the adhesive force between the fluorine-based PVDF film 1b and the EVA sheet 2b is weak.

DISCLOSURE OF INVENTION

Technical Problem

The present disclosure is directed to providing a back sheet for a solar cell module capable of improving power generation (photoconversion efficiency) of a solar cell because of superior heat-dissipating property, and a solar cell module including same.

The present disclosure is also directed to providing a back sheet for a solar cell module that can be supplied at low cost and has good adhesive force with a lower filling sheet of a solar cell module, and a solar cell module including same.

Solution to Problem

In some embodiments, there is provided a back sheet for solar cell module, including: a heat-dissipating metal layer; an upper anticorrosion layer formed on an upper surface of the heat-dissipating metal layer; a lower anticorrosion layer formed on a lower surface of the heat-dissipating metal layer; and a surface layer formed on the upper anticorrosion layer and attached to a filling sheet of a solar cell module.

In an exemplary embodiment, the surface layer includes a polyethylene based film layer or a fluorine coating layer. Specifically, the polyethylene based film layer may include a white inorganic material.

In an exemplary embodiment, a fluorine coating layer may be further formed on the lower anticorrosion layer.

In another exemplary embodiment, a heat-dissipating ink coating layer may be formed on the lower anticorrosion layer. A polyester based film layer may be further formed on the heat-dissipating ink coating layer, and a fluorine coating layer may be further formed on the polyester based film layer.

In other embodiments, there is provided a solar cell module including the back sheet for solar cell module according to the embodiments of the present disclosure.

Advantageous Effects of the Invention

A back sheet for a solar cell module according to the embodiments of the present disclosure has superior heat-dissipating property because it includes a heat-dissipating metal layer. The heat-dissipating property is further improved if it further includes a heat-dissipating ink coating layer. Accordingly, it can improve power generation (i.e., photoconversion efficiency) of a solar cell by effectively dissipating (discharging) heat generated in the solar cell.

In addition, the back sheet for a solar cell module according to the embodiments of the present disclosure can be supplied at low cost while ensuring weather resistance because of the fluorine coating layer. Further, adhesive force with a filling sheet of the solar cell module, moisture barrier property, etc. may be improved.

<Description of Numerals>

| | |
|---|---|
| 10: heat-dissipating metal layer | 20: anticorrosion layer |
| 30: surface layer | 32: polyethylene based film layer |
| 34, 60, 70: fluorine coating layer | |
| 40: heat-dissipating ink coating layer | 50: polyester film layer |
| 100: back sheet | 210: transparent member |
| 220: filling sheet | C: solar cell |

MODE FOR THE INVENTION

Hereinafter, the embodiments of the present disclosure are described in detail referring to the attached drawings. The attached drawings describe exemplary embodiments to assist in the understanding of the present disclosure.

Figure 2:
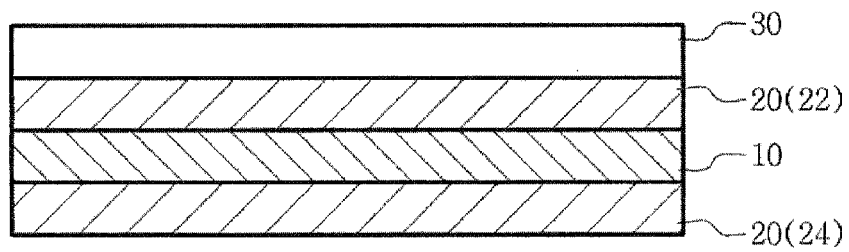
FIG. 2 schematically shows a configuration of a back sheet for a solar cell module according to a first embodiment of the present disclosure.

FIG. 2 schematically shows a configuration of a back sheet 100 for a solar cell module according to a first embodiment of the present disclosure.

Referring to FIG. 2, a back sheet for a solar cell module (hereinafter, simply "back sheet") according to a first embodiment of the present disclosure includes a heat-dissipating metal layer 10, an anticorrosion layer 20 formed on the heat-dissipating metal layer 10, and a surface layer 30 formed on the anticorrosion layer 20.

The heat-dissipating metal layer 10 is used for dissipation of heat. The heat-dissipating metal layer 10 receives heat generated in a solar cell C (see FIG. 10) and dissipates (discharges) it to outside. The heat-dissipating metal layer 10 also serves as a support of a back sheet 100.

The heat-dissipating metal layer 10 is comprised of a metal film having thermal conductivity. The heat-dissipating metal layer 10 may be comprised of one or more layer of metal film. The metal film is not particularly limited as long as it is made of a metal having thermal conductivity. Specifically, the metal of the metal film may be one or more selected from a group consisting of aluminum (Al), gold (Au), silver (Ag), copper (Cu), nickel (Ni), tin (Sn), zinc (Zn), tungsten (W) and iron (Fe). And, in an exemplary embodiment of the present disclosure, the metal film may include the above-listed individual metal, a mixture thereof or an alloy thereof (e.g., stainless steel), etc. More specifically, the metal film may be selected from an aluminum (Al) film or an aluminum (Al) alloy film, which has superior thermal conductivity and is favorable in terms of weight and cost.

The thickness of the heat-dissipating metal layer 10 is not particularly limited. For example, the heat-dissipating metal layer 10 may include one or more layer of a metal film having a thickness of 0.1-500 μm (micrometers) and may have a thickness of, for example, 0.1-1,000 μm. If the thickness of the heat-dissipating metal layer 10 is smaller than 0.1 μm, heat-dissipating property and supporting force may be insufficient. And, if the thickness exceeds 1,000 μm, it may be undesirable in terms of the flexibility and cost of the back sheet 100. In consideration of these factors, the heat-dissipating metal layer 10 may have a thickness of specifically 5-500 μm.

The anticorrosion layer 20 is used for the purpose of prevention of corrosion of the heat-dissipating metal layer 10, i.e. to prevent corrosion of the metal film, and may be formed on both the upper and lower surfaces of the heat-dissipating metal layer 10. Specifically, the back sheet 100 according to the present disclosure includes an upper anticorrosion layer 22 formed on the upper surface of the heat-dissipating metal layer 20 and a lower anticorrosion layer 24 formed on the lower surface of the heat-dissipating metal layer 10.

The anticorrosion layer 20, 22, 24 is not particularly limited as long as it can prevent corrosion of the heat-dissipating metal layer 10. The anticorrosion layer 20, 22, 24 may include an anticorrosive agent commonly used to prevent corrosion of metal. The anticorrosion layer 20, 22, 24, may be formed by coating one or more anticorrosive agent selected from a phosphoric acid-based anticorrosive agent, a chromium-based anticorrosive agent, etc. Also, the anticorrosion layer 20, 22, 24 may be formed by coating an organic anticorrosive agent such as a silane-based compound which forms a siloxane (Si—O—Si) bond with a metal, a thiol (—SH) group-containing alkanethiol-based compound which forms a metal-sulfur (S) covalent bond, or the like.

The anticorrosion layer 20, 22, 24 may have a thickness of, for example, 0.1-30 μm, although not being particularly limited thereto. If the thickness of the anticorrosion layer 20, 22, 24 is smaller than 0.1 μm, the anticorrosion effect may be insufficient. And, a thickness exceeding 30 µm may be undesirable in terms of cost. In consideration of these factors, the anticorrosion layer 20, 22, 24 may have a thickness of specifically 0.5-10 µm.

The surface layer 30 is formed on the upper anticorrosion layer 22 and is attached to a filling sheet 220 (see FIG. 10) of a solar cell module. Specifically, the surface layer 30 is the outermost layer of the back sheet 100 of the present disclosure and is attached to a lower filling sheet 222 (see FIG. 10) of the solar cell module. Specifically, the surface layer 30 may have heat resistance, durability, weather resistance, electrolyte resistance, etc. Further, the surface layer 30 may have good adhesive force with the lower filling sheet 222. For example, the surface layer 30 may be a polyethylene based film layer, so that it can be attached well to the lower filling sheet 222 which is formed of, for example, ethylene vinyl acetate (EVA), as will be described later.

FIG. 2 schematically shows a configuration of a back sheet 100 for a solar cell module according to a first embodiment of the present disclosure. Referring to FIG. 2, the back sheet 100 includes a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, and a surface layer 30 formed on the upper anticorrosion layer 22.

In accordance with the embodiment of the present disclosure, the back sheet 100 has superior heat-dissipating property because it includes the heat-dissipating metal layer 10 having thermal conductivity. Accordingly, the heat-dissipating metal layer 10 can improve power generation (photoconversion efficiency) of a solar cell C (see FIG. 10) by effectively dissipating (discharging) heat generated in the solar cell.

Figure 3:
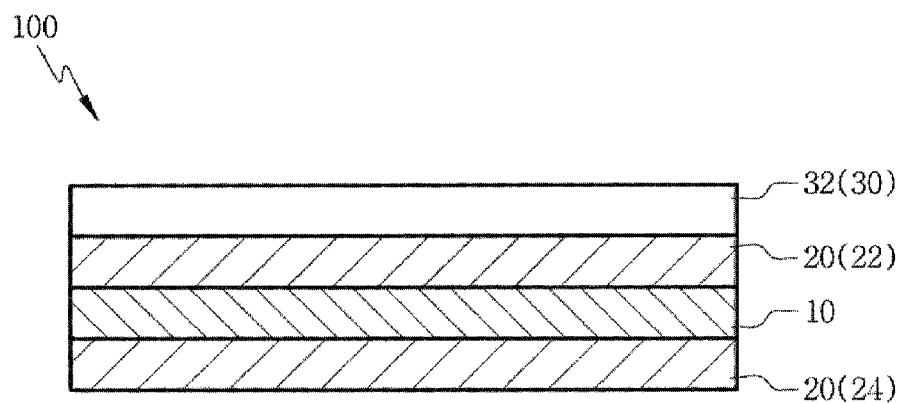
FIG. 3 schematically shows a configuration of a back sheet for a solar cell module according to a second embodiment of the present disclosure.

FIG. 3 schematically shows a configuration of a back sheet 100 for a solar cell module according to a second embodiment of the present disclosure.

Referring to FIG. 3, a surface layer 30 may include a polyethylene based film layer 32. Specifically, as shown in FIG. 3, a back sheet 100 according to a second embodiment of the present disclosure may have a stacked structure including a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, and a polyethylene based film layer 32 formed on the upper anticorrosion layer 22. The upper anticorrosion layer 22 and the polyethylene based film layer 32 may be attached by thermal bonding or using an adhesive. The adhesive is not particularly limited. For example, one or more adhesive selected from an acryl based resin, a urethane based resin, an epoxy based resin, etc. may be used.

The polyethylene based film layer 32 is formed of a polyethylene based film. The polyethylene based film is formed from a polyethylene based resin containing ethylene in the molecule and is not particularly limited as long as it contains ethylene in the molecule. The polyethylene based resin may be selected from a homopolymer or a copolymer of an ethylene monomer. For example, the copolymer may be a copolymer of an ethylene monomer with a propylene or butylene monomer. As non-limiting examples, the polyethylene based film may be a polyethylene (PE) film or a copolymer film of ethylene and propylene.

In an exemplary embodiment of the present disclosure, the surface layer 30 is attached to a filling sheet 220 of a solar cell module, as described above. If the surface layer 30 is formed of the polyethylene based film layer 32 as in this embodiment, a superior adhesive force may be achieved. That is to say, the polyethylene based film layer 32 may provide superior adhesive force between the back sheet 100 and the filling sheet 220. Specifically, the filling sheet 220 of the solar cell module may be formed of an ethylene vinyl acetate (EVA) sheet in general. In this case, since the polyethylene based film layer 32 contains ethylene, which is one of the monomers constituting the ethylene vinyl acetate (EVA) sheet, it may have superior adhesive force with the filling sheet 220.

Also, in another embodiment of the present disclosure, the polyethylene based film layer 32 may include a white inorganic material. Specifically, the polyethylene based film layer 32 may be a film further including the white inorganic material in addition to a polyethylene based resin. The white inorganic material is not particularly limited as long as it is a white inorganic material particle. Specifically, one or more selected from titanium dioxide, calcium oxide, magnesium oxide, etc. may be used. More specifically, the white inorganic material may include at least titanium dioxide. That is to say, the white inorganic material may be, for example, titanium dioxide or a mixture further including one or more selected from calcium oxide, magnesium oxide, etc., in addition to titanium dioxide.

If the polyethylene based film layer 32 includes the white inorganic material, mechanical strength and photoconversion efficiency of the solar cell may be improved. That is to say, the white inorganic material confers improves the mechanical strength of the polyethylene based film layer 32 and thus improves the durability of the back sheet 100. Also, the white inorganic material may confer reflecting ability to the polyethylene based film layer 32, so that incident sunlight can be reflected toward the solar cell C (see FIG. 10). Accordingly, the amount of light captured by the solar cell C may be increased and photoconversion efficiency may be improved. As described above, the white inorganic material may include specifically titanium dioxide. The titanium dioxide may be advantageously used in the present disclosure since it exhibits very superior sunlight reflecting ability, etc.

The polyethylene based film layer 32 may include the white inorganic material in an amount of 2-20 parts by weight based on 100 parts by weight of the polyethylene based resin. If the content of the white inorganic material is less than 2 parts by weight, the effect of improving mechanical strength, sunlight reflecting ability, etc. may be insufficient. And, if the content of the white inorganic material exceeds 20 parts by weight, adhesive force may decrease. That is to say, if the content of the white inorganic material exceeds 20 parts by weight, adhesive force between the polyethylene based film layer 32 and the filling sheet 220 and interlayer adhesive force between the polyethylene based film layer 32 and the upper anticorrosion layer 22 may weak because the content of the polyethylene based resin decreases relatively. In consideration of the mechanical strength, sunlight reflecting ability, adhesive force, etc., the white inorganic material may be included in an amount of more specifically 5-15 parts by weight based on 100 parts by weight of the polyethylene based resin.

The white inorganic material may have a particle size not greater than 30 µm. For example, the white inorganic material may have a particle size of 0.1-30 µm. If the particle size of the white inorganic material is smaller than 0.1 µm, improvement of sunlight reflecting ability may be slight. And, if it exceeds 30 µm, adhesive force of the polyethylene based resin may be negatively affected. More specifically, the white inorganic material may have an average particle size of 2-10 µm.

The white inorganic material may be, for example, titanium dioxide.

The polyethylene based film layer 32, which includes the white inorganic material, may have a thickness of 10-500 μm. If the thickness of the polyethylene based film layer 32 is smaller than 10 μm, the improvement of mechanical strength, sunlight reflecting ability, adhesive force, etc. may be insufficient. And, if it exceeds 500 μm, the flexibility and heat-dissipating property of the back sheet 100 may be negatively affected and cost may increase. More specifically, the polyethylene based film layer 32 may include the white inorganic material and may have a thickness of 50-300 μm, in consideration of these factors.

Figure 4:
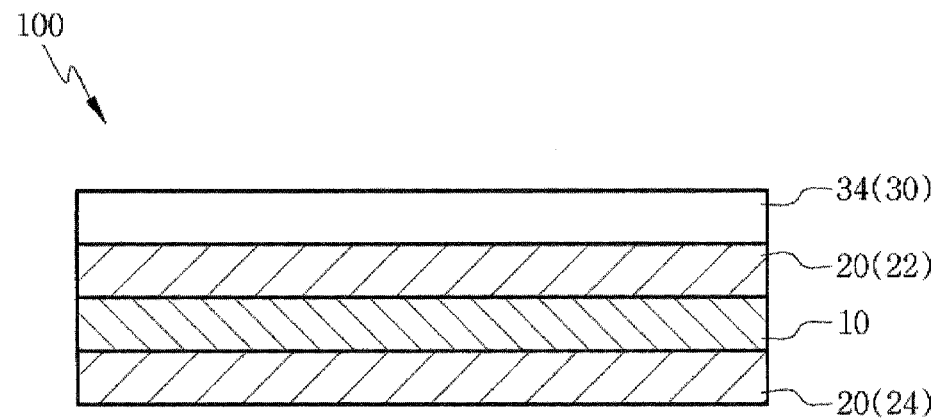
FIG. 4 schematically shows a configuration of a back sheet for a solar cell module according to a third embodiment of the present disclosure.

FIG. 4 schematically shows a configuration of a back sheet 100 for a solar cell module according to a third embodiment of the present disclosure.

Referring to FIG. 4, a surface layer 30 may include a fluorine coating layer 34. Specifically, as shown in FIG. 4, a back sheet 100 according to a third embodiment of the present disclosure may have a stacked structure including a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, and a fluorine coating layer 34 formed on the upper anticorrosion layer 22.

Figure 1:
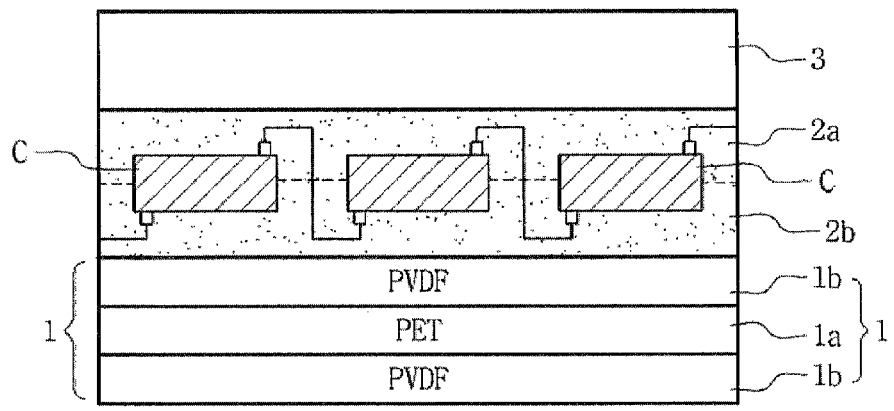
FIG. 1 schematically shows a configuration of a solar cell module and a back sheet according to the existing art.

The fluorine coating layer 34 is used to improve weather resistance (UV barrier property, deterioration resistance, dimensional stability, etc.) and is formed by coating a fluorine resin composition on the upper anticorrosion layer 22. That is to say, in the present disclosure, the fluorine coating layer 34 is not formed by attaching a fluorine-based film 1b (see FIG. 1) using an adhesive, as in the prior art, but is formed by coating a fluorine resin composition in liquid state and then solidifying (hardening) it. Accordingly, according to the embodiment of the present disclosure, the cost of the back sheet 100 can be decreased and interlayer adhesive force can be improved. Specifically, since the inexpensive fluorine resin composition in liquid state is coated to form the weather-resistant fluorine coating layer 34, instead of attaching the expensive fluorine-based film 1b such as PVDF, the cost of the back sheet 100 can be reduced. In addition, the coating and hardening of the fluorine resin composition provide good interlayer adhesive force between the upper anticorrosion layer 22 and the fluorine coating layer 34.

Specifically, the fluorine coating layer 34 may have a thickness of 5-30 μm. If the thickness of the fluorine coating layer 34 is smaller than 5 μm, the improvement of weather resistance, etc. may be insufficient. And, if the thickness of the fluorine coating layer 34 exceeds 30 μm, a long time is required for hardening and it may be difficult to reduce cost.

When the fluorine coating layer 34 is coated with a thickness of 5-30 μm, the cost can be reduced, for example, by half as compared to when the existing fluorine-based film 1b such as PVDF is used. In consideration of weather resistance, cost, etc., the fluorine coating layer 34 have a thickness of more specifically 10-20 μm.

The fluorine coating layer 34 is formed by coating the fluorine resin composition. The fluorine resin composition includes at least a fluorine resin and may further include a solvent as a diluent for improving coating performance of the fluorine resin. Specifically, the fluorine resin may be one having weather resistance and hydrolysis resistance. The fluorine resin is not particularly limited as long as it contains fluorine (F) in the molecule. For example, the fluorine resin may be one or more selected from polytetrafluoroethylene (PTFE), a perfluoroalkoxy (PFA) resin which is a copolymer of tetrafluoroethylene and perfluoroalkyl vinyl ether, a copolymer of tetrafluoroethylene and hexafluoropropylene, a copolymer of tetrafluoroethylene and ethylene or propylene, polychlorotrifluoroethylene (PCTFE), polyvinylidene fluoride (PVDF), polyvinyl fluoride (PVF), etc.

Further, the fluorine resin may be an ethylene-containing fluorine resin containing fluorine and ethylene in the molecule. For example, the fluorine resin may be one or more ethylene-containing fluorine resin selected from polytetrafluoroethylene (PTFE), a perfluoroalkoxy (PFA) resin which is a copolymer of tetrafluoroethylene and perfluoroalkyl vinyl ether, a copolymer of tetrafluoroethylene and hexafluoropropylene, a copolymer of tetrafluoroethylene and ethylene or propylene, polychlorotrifluoroethylene (PCTFE), etc.

The above-described ethylene-containing fluorine resins containing fluorine and ethylene in the molecule are advantageous in terms of improvement of adhesive force together with weather resistance, hydrolysis resistance, etc. Specifically, a filling sheet 220 (see FIG. 10) of the solar cell module may be formed of an ethylene vinyl acetate (EVA) sheet. Since the ethylene-containing fluorine resin contains ethylene which is a monomer constituting the ethylene vinyl acetate (EVA) sheet, adhesive force may be improved. That is to say, since the upper fluorine coating layer 34 is attached to the filling sheet 220, if the upper fluorine coating layer 34 includes the above-described ethylene-containing fluorine resin, it may be attached to the filling sheet 220 with high strength.

The solvent is not particularly limited as long as it provides a viscosity suitable for coating by diluting the fluorine resin. For example, the solvent may be one or more organic solvent selected from an alcohol based, a glycol based, a ketone based, a formamide based, etc. As specific examples, the solvent may be one or more selected from methanol, ethanol, isopropanol, methylene glycol, ethylene glycol, methyl ethyl ketone (MEK), dimethylformamide (DMF), etc.

Although not being particularly limited thereto, the fluorine resin composition may include the solvent in an amount of 50-300 parts by weight based on 100 parts by weight of the fluorine resin. If the content of the solvent is less than 50 parts by weight, coating performance may be not good because of high viscosity. And, if it exceeds 300 parts by weight, a long time may be required for hardening (drying).

The method and number of coating of the fluorine resin composition for forming the fluorine coating layer 34 are not particularly limited. For example, the fluorine resin composition may be coated one or more times by one or more coating method selected from spin coating, dip coating, bar coating, spray coating, inkjet printing, gravure coating, screen printing, etc.

Figure 5:
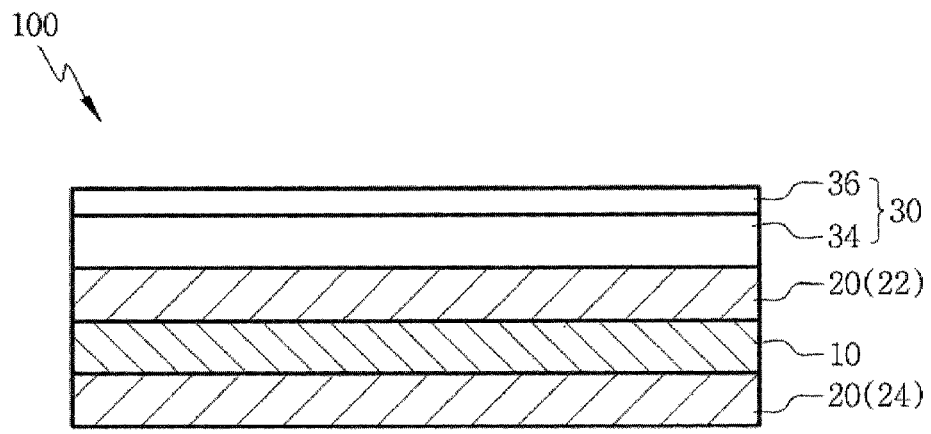
FIG. 5 shows a configuration of a back sheet for a solar cell module according to a fourth embodiment of the present disclosure.

FIG. 5 schematically shows a configuration of a back sheet 100 according to a fourth embodiment of the present disclosure.

Referring to FIG. 5, a surface layer 30 includes a fluorine coating layer 34 and may further include a primer layer 36 formed on the fluorine coating layer 34. Specifically, as shown in FIG. 5, a back sheet 100 according to the fourth embodiment of the present disclosure has a stacked structure including a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, a fluorine coating layer 34 formed on the upper anticorrosion layer 22, and a primer layer 36 formed on the fluorine coating layer 34.

The primer layer 36 is attached to a filling sheet 220 of a solar cell module.

The primer layer 36 is for improving adhesive force between the fluorine coating layer 34 and the filling sheet 220 and is formed by coating an adhesive resin. For example, the primer layer 36 may be formed by coating one or more adhesive resin selected from an acryl based resin, a urethane based resin, an epoxy based resin, an ester based resin, etc. And, although not being particularly limited thereto, the primer layer 36 may have a thickness of not greater than 10 μm, specifically 0.2-10 μm.

Figure 6:
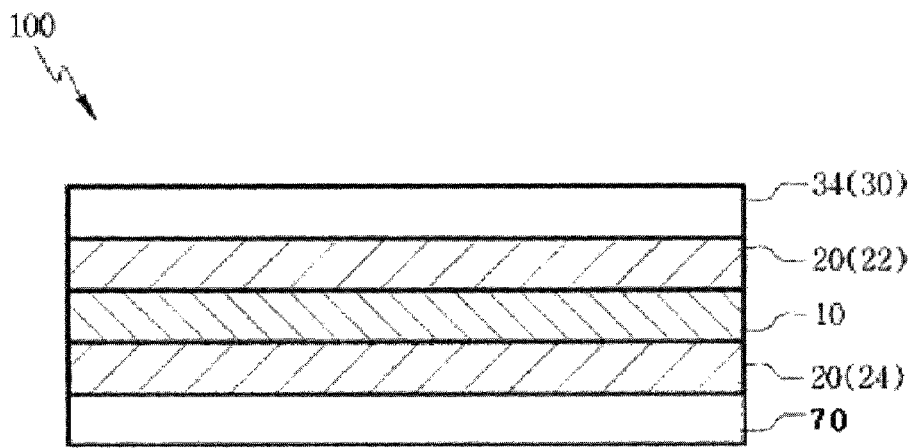
FIG. 6 shows a configuration of a back sheet for a solar cell module according to a fifth embodiment of the present disclosure.

FIG. 6 schematically shows a configuration of a back sheet 100 according to a fifth embodiment of the present disclosure.

Referring to FIG. 6, a back sheet 100 according to a fifth embodiment of the present disclosure may further include a fluorine coating layer 70. Specifically, as shown in FIG. 6, a back sheet 100 according to a fifth embodiment of the present disclosure may have a stacked structure including a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, a surface layer 30 formed on the upper anticorrosion layer 22, and a fluorine coating layer 70 formed on the lower anticorrosion layer 24.

The fluorine coating layer 70 improves the weather resistance of the back sheet. The fluorine coating layer 70 is formed by coating a fluorine resin composition in liquid state on the lower anticorrosion layer 24. The fluorine resin composition includes at least a fluorine resin and may further include a solvent as a diluent for improving coating performance of the fluorine resin. Specifically, the fluorine resin may be one having weather resistance and hydrolysis resistance. The fluorine resin is not particularly limited as long as it contains fluorine (F) in the molecule. To coat the fluorine resin composition as described above is more advantageous in reducing the cost of the back sheet than to stack a fluorine-based film.

For example, the fluorine resin may be one or more selected from polytetrafluoroethylene (PTFE), a perfluoroalkoxy (PFA) resin which is a copolymer of tetrafluoroethylene and perfluoroalkyl vinyl ether, a copolymer of tetrafluoroethylene and hexafluoropropylene, a copolymer of tetrafluoroethylene and ethylene or propylene, polychlorotrifluoroethylene (PCTFE), polyvinylidene fluoride (PVDF), polyvinyl fluoride (PVF), etc.

The solvent is not particularly limited as long as it provides a viscosity suitable for coating by diluting the fluorine resin. For example, the solvent may be one or more organic solvent selected from an alcohol based, a glycol based, a ketone based, a formamide based, etc. As specific examples, the solvent may be one or more selected from methanol, ethanol, isopropanol, methylene glycol, ethylene glycol, methyl ethyl ketone (MEK), dimethylformamide (DMF), etc.

Although not being particularly limited thereto, the fluorine resin composition may include the solvent in an amount of 50-300 parts by weight based on 100 parts by weight of the fluorine resin. If the content of the solvent is less than 50 parts by weight, coating performance may be not good because of high viscosity. And, if it exceeds 300 parts by weight, a long time may be required for hardening (drying).

The method and number of coating of the fluorine resin composition for forming the fluorine coating layer 70 are not particularly limited. For example, the fluorine resin composition may be coated one or more times by one or more coating method selected from spin coating, dip coating, bar coating, spray coating, inkjet printing, gravure coating, screen printing, etc.

Figure 7:
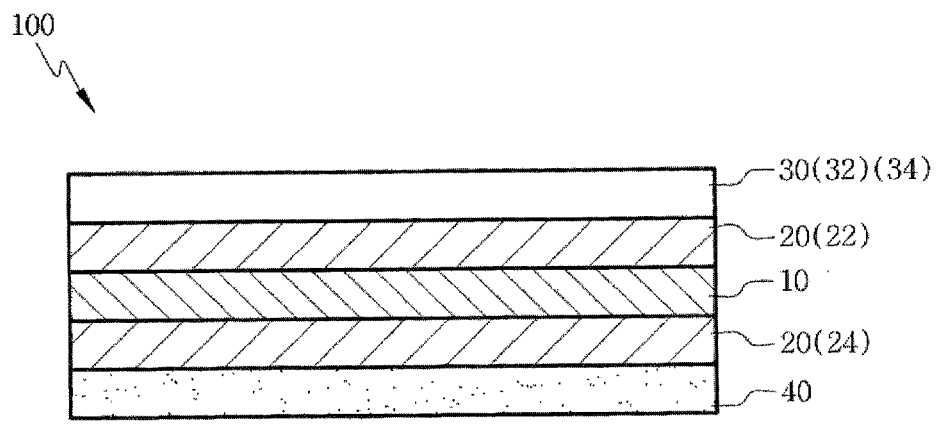
FIG. 7 shows a configuration of a back sheet for a solar cell module according to a sixth embodiment of the present disclosure.

FIG. 7 schematically shows a configuration of a back sheet 100 for a solar cell module according to a sixth embodiment of the present disclosure.

Referring to FIG. 7, a back sheet 100 according to the embodiment of the present disclosure may further include a heat-dissipating ink coating layer 40. Specifically, as shown in FIG. 7, a back sheet 100 according to a sixth embodiment of the present disclosure may have a stacked structure including a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, a surface layer 30 formed on the upper anticorrosion layer 22, and a heat-dissipating ink coating layer 40 formed on the lower anticorrosion layer 24.

The heat-dissipating ink coating layer 40 may improve the heat-dissipating property and durability of the back sheet 100. The heat-dissipating ink coating layer 40 is formed by coating a heat-dissipating ink composition including a heat-dissipating material and a binder resin on the lower anticorrosion layer 24. The heat-dissipating material may be in a particle form and serves as a thermally conducting material for improving heat-dissipating property. And, the binder resin improves adhesive force between the heat-dissipating material particles, and between the heat-dissipating material and the lower anticorrosion layer 24.

The heat-dissipating material may have thermal conductivity. Specifically, the heat-dissipating material may be one or more selected from a carbon material, a metal particle, etc. For example, the carbon material may be one or more selected from a group consisting of graphite, graphene, carbon nanotube (CNT), carbon nanofiber (CNF), etc. Although not being particularly limited thereto, the carbon material may have a particle size of not greater than 200 μm, specifically between 5 nm (nanometers) and 200 μm. And, the metal particle may be one or more selected from a group consisting of aluminum (Al), gold (Au), silver (Ag), copper (Cu), nickel (Ni), tin (Sn), zinc (Zn), tungsten (W) and iron (Fe). Specifically, the metal particle may be the above-listed individual metal, a mixture thereof or an alloy thereof (e.g., stainless steel), etc.

The binder resin is not particularly limited as long as it has adhesion property and may be selected from a natural resin or a synthetic resin. For example, one or more adhesive selected from an acryl based resin, an epoxy based resin, a urethane based resin, a urea based resin, a polyolefin (polyethylene, polypropylene, etc.) based resin, etc. may be used.

The heat-dissipating ink coating layer 40 may be formed by coating a heat-dissipating ink composition in liquid or paste state, including 20-300 parts by weight of the heat-dissipating material based on 100 parts by weight of the binder resin. If the content of the heat-dissipating material is less than 20 parts by weight, the effect of improving heat-dissipating property may be insufficient because of low thermal conductivity. And, if it exceeds 300 parts by weight, coating performance and adhesive force may decrease because of relative low content of the binder resin. The heat-dissipating ink composition for forming the heat-dissipating ink coating layer 40 may further include one or more selected from, in addition to the heat-dissipating material and the binder resin, a photoinitiator, a curing agent, a dispersing agent, a solvent, an antioxidant, a defoaming agent, etc., if necessary. For example, the heat-dissipating ink composition may be coated one or more times by one or more coating method selected from spin coating, dip coating, bar coating, inkjet printing, gravure coating, microgravure coating, kiss gravure coating, comma knife coating, roll coating, spray coating, Meyer bar coating, slot die coating, reverse coating, flexo coating, offset coating, etc.

Although not being particularly limited thereto, the heat-dissipating ink coating layer 40 may have a thickness between tens of nanometers to 200 μm. If the heat-dissipating ink coating layer 40 is too thin, the effect of improving heat-dissipating property and durability is only slight and heat-dissipating property may partially decrease because of surface cracking caused by external impact. And, if the thickness exceeds 200 μm, the flexibility of the back sheet 100 may decrease and it may be undesirable in terms of cost. In consideration of these factors, the heat-dissipating ink coating layer 40 may have a thickness of specifically 1-120 μm, more specifically 5-90 μm.

Figure 8:
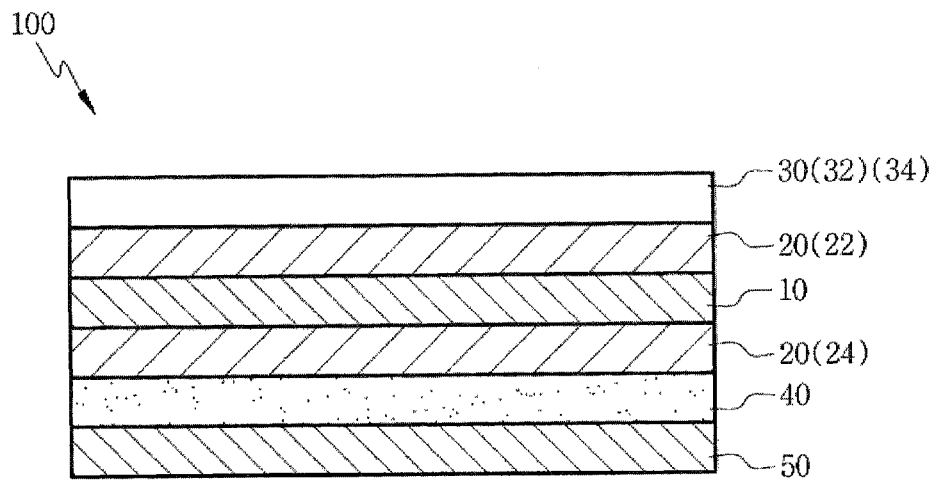
FIG. 8 shows a configuration of a back sheet for a solar cell module according to a seventh embodiment of the present disclosure.

FIG. 8 schematically shows a configuration of a back sheet 100 for a solar cell module according to a seventh embodiment of the present disclosure.

Referring to FIG. 8, a back sheet 100 according to the embodiment of the present disclosure may further include a polyester film layer 50. Specifically, as shown in FIG. 8, a back sheet 100 for a solar cell module according to a seventh embodiment of the present disclosure may have a stacked structure including a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, a surface layer 30 formed on the upper anticorrosion layer 22, a heat-dissipating ink coating layer 40 formed on the lower anticorrosion layer 24, and a polyester film layer 50 formed on the heat-dissipating ink coating layer 40.

The polyester film layer 50 is for providing scratch resistance to the heat-dissipating ink coating layer 40 and is formed of a polyester film. The polyester film may be formed from a polyester-based polymer polymerized from a compound having a carboxyl group and a compound having a hydroxyl group, although not being particularly limited thereto. The polyester film may be selected from a polyethylene terephthalate (PET) film or a polyethylene naphthalate (PEN) film, which are advantageous not only in scratch resistance but also in heat resistance, mechanical strength, etc. Also, although not being particularly limited thereto, the polyester film layer 50 may have a thickness of 6-500 μm, more specifically 12-300 μm.

Figure 9:
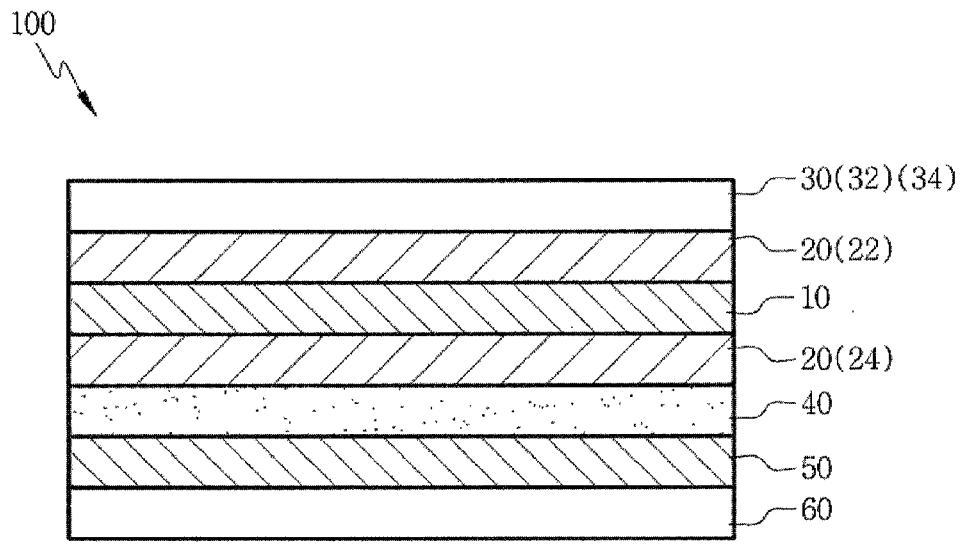
FIG. 9 shows a configuration of a back sheet for a solar cell module according to an eighth embodiment of the present disclosure.

FIG. 9 schematically shows a configuration of a back sheet 100 for a solar cell module according to an eighth embodiment of the present disclosure.

Referring to FIG. 9, a back sheet 100 according to an eighth embodiment of the present disclosure may further include a fluorine coating layer 60 formed on a polyester film layer 50. Specifically, as shown in FIG. 9, a back sheet 100 according to an eighth embodiment of the present disclosure may have a stacked structure including a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, a surface layer 30 formed on the upper anticorrosion layer 22, a heat-dissipating ink coating layer 40 formed on the lower anticorrosion layer 24, a polyester film layer 50 formed on the heat-dissipating ink coating layer 40, and a fluorine coating layer 60 formed on the polyester film layer 50.

The fluorine coating layer 60 formed on the polyester film layer 50 is for improving the weather resistance of the polyester film layer 50. Detailed description thereabout will be omitted since it is the same as given above. That is to say, since the fluorine coating layer 60 (see FIG. 9) formed on the polyester film layer 50 according to the eighth embodiment of the present disclosure is identical in constitution to the fluorine coating layer 34 (FIG. 4) constituting the surface layer 30, detailed description thereabout will be omitted.

The fluorine coating layer 60 formed on the lower surface of the polyester film layer 50 may be formed by coating a fluorine resin composition including a fluorine resin and a solvent on the lower surface of the polyester film layer 50. Specifically, the fluorine resin may contain fluorine and ethylene in the molecule. For example, the fluorine resin constituting the fluorine coating layer 60 formed on the lower surface of the polyester film layer 50 may be one or more ethylene-containing fluorine resin selected from polytetrafluoroethylene (PTFE), a perfluoroalkoxy (PFA) resin which is a copolymer of tetrafluoroethylene and perfluoroalkyl vinyl ether, a copolymer of tetrafluoroethylene and hexafluoropropylene, a copolymer of tetrafluoroethylene and ethylene or propylene, polychlorotrifluoroethylene (PCTFE), etc.

If the fluorine coating layer 60 formed on the polyester film layer 50 includes the ethylene-containing fluorine resin as described above, adhesive force with the polyester film layer 50 may be improved advantageously. That is to say, since the polyester film layer 50 may be formed of a polyethylene terephthalate (PET) film or a polyethylene naphthalate (PEN) film, as described above, the ethylene-containing fluorine resin, which contains ethylene which is a monomer constituting the polyethylene terephthalate (PET) film or polyethylene naphthalate (PEN) film, may have improved adhesive force with the polyester film layer 50.

Figure 10:
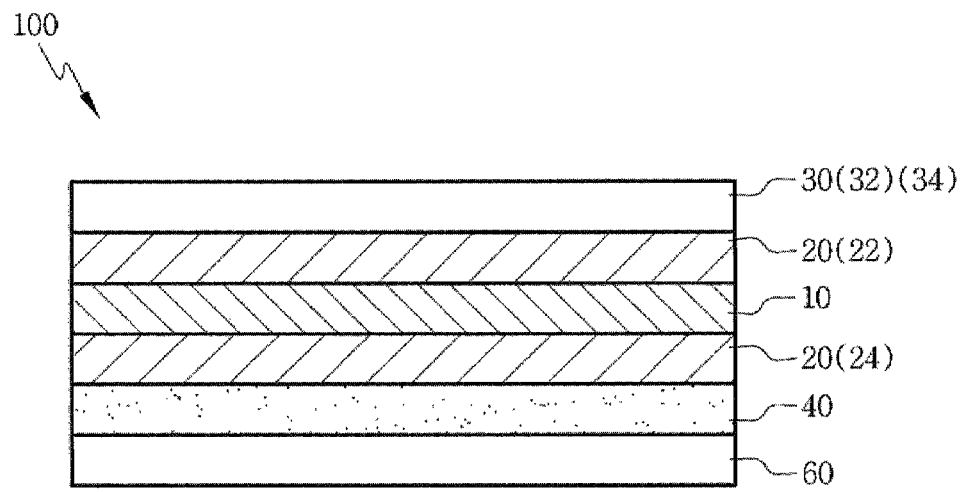
FIG. 10 shows a configuration of a back sheet for a solar cell module according to a ninth embodiment of the present disclosure.

FIG. 10 schematically shows a configuration of a back sheet 100 for a solar cell module according to a ninth embodiment of the present disclosure.

Referring to FIG. 10, a back sheet 100 according to the embodiment of the present disclosure may further include a fluorine coating layer 60 formed on a heat-dissipating ink coating layer 40. That is to say, the fluorine coating layer 60 may be formed on the lower surface of the heat-dissipating ink coating layer 40. Specifically, as shown in FIG. 10, a back sheet 100 according to the ninth embodiment of the present disclosure may have a stacked structure including a heat-dissipating metal layer 10, an upper anticorrosion layer 22 formed on the upper surface of the heat-dissipating metal layer 10, a lower anticorrosion layer 24 formed on the lower surface of the heat-dissipating metal layer 10, a surface layer 30 formed on the upper anticorrosion layer 22, a heat-dissipating ink coating layer 40 formed on the lower anticorrosion layer 24, and a fluorine coating layer 60 formed on the heat-dissipating ink coating layer 40.

The fluorine coating layer 60 formed on the heat-dissipating ink coating layer 40 is for improving surface scratch resistance and weather resistance of the heat-dissipating ink coating layer 40, and detail description thereabout will be omitted since it is the same as above.

Specifically, as shown in FIG. 10, the presence of the heat-dissipating metal layer 10 and the heat-dissipating ink coating layer 40 may provide maximized heat-dissipating property and the presence of the fluorine coating layer 60 may provide superior weather resistance, etc. Also, as shown in FIG. 10, the surface layer 30 may include a polyethylene based film layer 32 or a fluorine coating layer 34. If the surface layer 30 includes a fluorine coating layer 34, the stacked structure shown in FIG. 10 includes fluorine coating layers 34, 60 on both surfaces, and this allows maximized weather resistance as well as low cost. And, if the surface layer 30 includes a fluorine coating layer 34, a primer layer 36 may be further formed on the upper surface of the fluorine coating layer 34 to provide better adhesive force with a filling sheet 220 (see FIG. 10), as described above.

Figure 11:
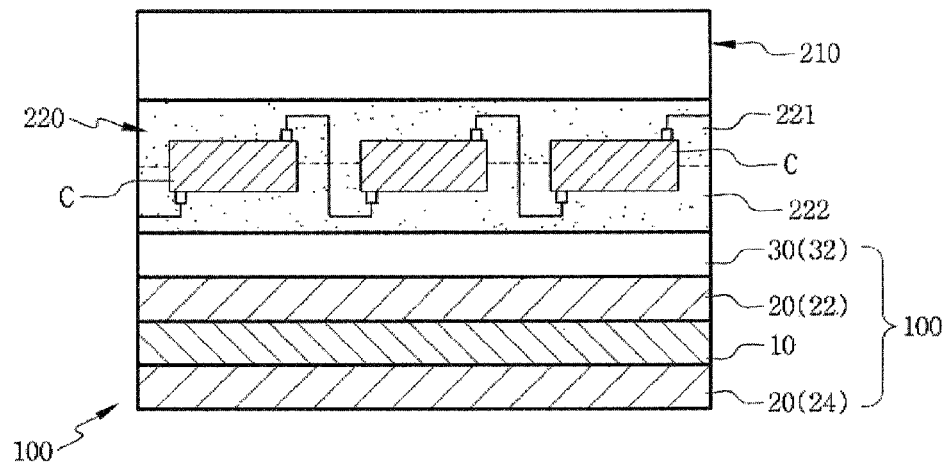
FIG. 11 shows a configuration of a solar cell module according to an embodiment of the present disclosure, wherein the back sheet of FIG. 3 is used.
Figure 12:
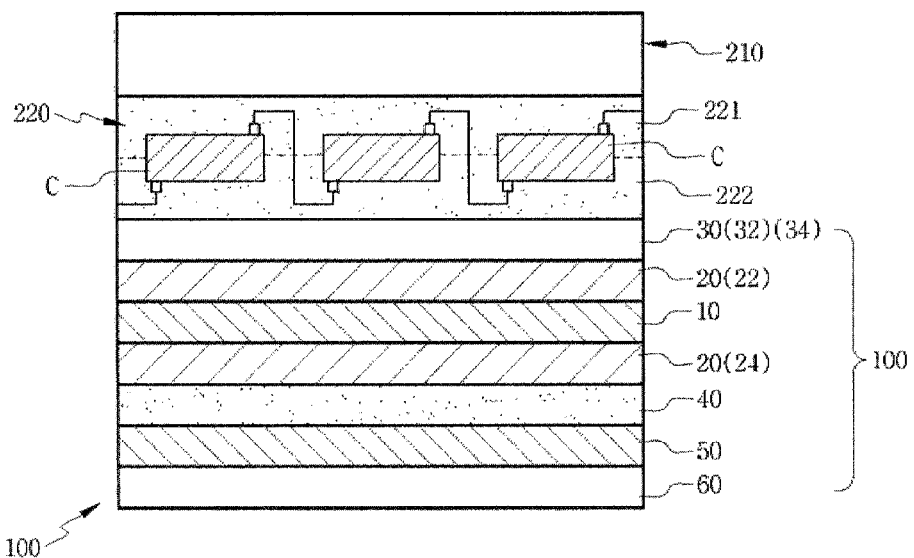
FIG. 12 shows a configuration of a solar cell module according to an embodiment of the present disclosure, wherein the back sheet of FIG. 9 is used.

In another embodiment, the present disclosure provides a solar cell module including the back sheet 100 described above. FIGS. 11 and 12 show exemplary solar cell modules according to the embodiments of the present disclosure. FIG. 11 shows an exemplary solar cell module wherein the back sheet 100 of FIG. 3 is used. And, FIG. 12 shows an exemplary solar cell module wherein the back sheet 100 of FIG. 9 is used, with a surface layer 30 including a fluorine coating layer 34.

Referring to FIG. 11 and FIG. 12, a solar cell module according to an embodiment of the present disclosure includes a transparent member 210, a filling sheet 220, solar cells C, and the back sheet 100 described above.

The transparent member 210 protects the upper side of the solar cell C. For the transparent member, a reinforced glass which is advantageous in terms of protection of the solar cell and incidence of light may be used. The filling sheet 220 is the portion where a plurality of electrically connected solar cells C are fixed and filled. As seen from FIG. 11 and FIG. 12, it may include an upper filling sheet 221 and a lower filling sheet 222. Specifically, for the filling sheet 220, 221, 222, an ethylene vinyl acetate (EVA) sheet may be used.

As seen from FIG. 11 and FIG. 12, the back sheet 100 is attached to a lower surface of the filling sheet 220, specifically to a lower surface of the lower filling sheet 222. The back sheet 100 and the lower filling sheet 222 may be attached by thermal bonding or using an adhesive. The adhesive is not particularly limited. For example, one or more adhesive selected from an acryl based resin, a urethane based resin, an epoxy based resin, etc. may be used. Specifically, the back sheet 100 and the lower filling sheet 222 may be attached by thermal bonding. In this case, the surface layer 30 of the back sheet 100 is attached to the lower filling sheet 222. That is to say, a polyethylene based film layer 32 or a fluorine coating layer 34 is attached thereto. And, in case of the back sheet 100 shown in FIG. 5, a primer layer 36 is attached to the lower filling sheet 222.

As described above, the back sheet according to the exemplary embodiments of the present disclosure includes the heat-dissipating metal layer 10 having thermal conductivity and thus has superior heat-dissipating property. And, the back sheet has further improved heat-dissipating property as well as durability when it further includes the heat-dissipating ink coating layer 40. As a result, the heat generated in the solar cell C can be effectively dissipated (discharged) and thus the power generation (photoconversion efficiency) of the solar cell can be improved.

Also, according to the embodiments of the present disclosure, the presence of the fluorine coating layer 34 ensures weather resistance and lower cost. That is to say, since the inexpensive fluorine resin composition in liquid state is coated to form the fluorine coating layer 34, 60, 70, instead of using the expensive fluorine-based film 1b (see FIG. 1) such as PVDF, a back sheet 100 having comparable weather resistance can be provided at lower cost.

Further, the presence of the polyethylene based film layer 32 and the fluorine coating layer 34 provides superior adhesive force with the filling sheet 220 of the solar cell module. And, when the polyethylene based film layer 32 includes a white inorganic material (specifically, titanium dioxide), mechanical strength, sunlight reflecting ability, etc. are also improved. In addition, the back sheet according to the present disclosure has superior moisture barrier property (moisture permeability preventing property).

Hereinafter, the present disclosure will be described in detail through examples and a comparative example. However, the following examples are for illustrative purposes only and it will be apparent to those of ordinary skill in the art that the scope of the present disclosure is not limited by the examples.

EXAMPLE 1

10 parts by weight of titanium dioxide ($TiO_2$) having an average particle size of 3 μm was mixed with 100 parts by weight of polyethylene (PE). The mixture was prepared into a 150-μm thick white PE film (hereinafter, referred to as 'W-PE film') through biaxial stretching.

After forming anticorrosion layers on both surfaces of a 80-μm thick aluminum (Al) film, the W-PE film ($PE+TiO_2$) prepared above was attached on surface thereof using an acryl-based adhesive to prepare a back sheet having a stacked structure of W-PE film/anticorrosion layer/Al film/anticorrosion layer. The anticorrosion layer was formed by treating the both surfaces of the aluminum (Al) film with chromic acid to a thickness of about 1 μm.

EXAMPLE 2

A back sheet was prepared in the same manner as in Example 1, except for further forming a fluorine coating layer.

Specifically, a back sheet having a stacked structure of W-PE film/anticorrosion layer/Al film/anticorrosion layer/fluorine coating layer was prepared by gravure-coating and hardening a fluorine resin composition obtained by mixing PTFE and ethanol at 1:1 (weight ratio) on an anticorrosion layer with no W-PE film ($PE+TiO_2$) attached to a thickness of 20 μm.

EXAMPLE 3

A back sheet was prepared in the same manner as in Example 1, except for further forming a heat-dissipating ink coating layer. Specifically, a back sheet having a stacked structure of W-PE film/anticorrosion layer/Al film/anticorrosion layer/heat-dissipating ink coating layer was prepared by gravure-coating and hardening a liquid ink composition including an acryl resin and a graphite powder at a weight ratio of 1:1 on an anticorrosion layer to a thickness of 25 μm.

EXAMPLE 4

A back sheet was prepared in the same manner as in Example 3, except for further forming a fluorine coating layer instead of the W-PE film. Specifically, a back sheet having a stacked structure of fluorine coating layer (PTFE)/anticorrosion layer/Al film/anticorrosion layer/heat-dissipating ink coating layer was prepared by coating a fluorine resin composition obtained by mixing PTFE and ethanol at 1:1 (weight ratio) on an anticorrosion layer formed on an Al film to a thickness of 15 μm.

COMPARATIVE EXAMPLE

As an existing back sheet, a back sheet having a stacked structure of PVDF film/PET film/PVDF film was prepared by attaching PVDF films (thickness: 30 μm) on both surfaces of a PET film (thickness: 250 μm).

The back sheet samples of the examples and the comparative example were subjected to evaluation of durability, EVA adhesive force, moisture permeability, heat-dissipating property and power generation (%). The result is shown in [Table 1].

(1) Weather Resistance

Weather resistance was evaluated as superior (⊚), good (○) or unsatisfactory (Δ) using a weather resistance tester (Xenon Weather-Ometer, ATLAS Ci3000+) using xenon arc under the condition of constant temperature and humidity (80° C., 80% RH) and 3000 hours according to usual method.

(2) Adhesive Force with EVA

Each back sheet sample was attached to an EVA sheet by thermal bonding. The back sheet sample was cut to A4 size and the EVA sheet was cut to a smaller size than the back sheet sample. They were overlapped and bonded by putting in a convection oven at 150° C. for 15 minutes. After taking out of the oven and cooling, followed by cutting to a size of 15 mm×15 mm, peel strength between the EVA sheet and the back sheet (i.e., adhesive force with EVA) was measured.

(3) Moisture Permeability

Each back sheet sample was cut to a size of 15 mm×15 mm using a cutter bar and moisture permeability was measured.

(4) Heat-Dissipating Ability

Each back sheet sample was attached to an aluminum plate equipped with a heat source (LED lamp) initially set at 100° C., and temperature was measured 1 hour later.

(5) Power Generation (%)

Power generation of a solar cell with the back sheet attached was measured relative to that before attaching the back sheet as 100%.

TABLE 1

<Physical property measurement result>

| Stacked structure of back sheet | Comp. Ex. PVDF film/ PET film/ PVDF film | Ex. 1 W-PE/ anticorrosion layer/Al film/ anticorrosion layer | Ex. 2 W-PE/ anticorrosion layer/Al film/ anticorrosion layer/fluorine coating layer | Ex. 3 W-PE/ anticorrosion layer/Al film/ anticorrosion layer/ heat-dissipating ink coating layer | Ex. 4 fluorine coating layer/ anticorrosion layer/ Al film/ anticorrosion layer/ heat-dissipating ink coating layer |
|---|---|---|---|---|---|
| Weather resistance | ○ | ○ | ○ | ⊚ | ⊚ |
| adhesive force with EVA (kgf/15 mm) | 0.5 | unpeeled | unpeeled | unpeeled | 1.2 |
| Moisture permeability (g/m² · day) | 2.4 | 0 | 0 | 0 | 0 |
| Heat-dissipating ability | 100° C. | 86° C. | 86° C. | 80° C. | 80° C. |
| Power generation (%) | 100 | 112 | 112 | 115 | 115 |

As seen from [Table 1], the back sheets of Examples 1-4 according to the present disclosure exhibit comparable or better weather resistance and superior adhesive force with the EVA sheet, as compared to Comparative Example. In particular, Examples 1-3 wherein the W-PE film (PE+TiO$_2$) was used exhibit very superior adhesive force with EVA.

Further, the back sheets of Examples 1-4 according to the present disclosure exhibit superior heat-dissipating property and power generation, as compared to Comparative Example. Also, it can be seen that the back sheets of Examples of Examples 3 and 4 wherein the heat-dissipating ink coating layer was further formed exhibit more improved heat-dissipating ability and power generation. In addition, it can be seen that the back sheets of Examples 1-4 according to the present disclosure exhibit superior moisture barrier property with low moisture permeability, as compared to Comparative Example.

INDUSTRIAL APPLICABILITY

The present disclosure relates to a back sheet for a solar cell module that can improve power generation of a solar cell because of superior heat-dissipating property, can be provided at low cost and has superior adhesive force, etc. and a solar cell module including same.

The invention claimed is:

1. A back sheet for a solar cell module, comprising:
 a lower anticorrosion layer;
 a heat-dissipating metal layer on the lower anticorrosion layer;
 an upper anticorrosion layer formed on an upper surface of the heat-dissipating metal layer; and
 a surface layer formed on the upper anticorrosion layer opposite the heat dissipating metal layer,
 wherein each of the lower anticorrosion layer and the upper anticorrosion layer is formed by coating one or more anticorrosive agent on the heat dissipating metal layer, said anticorrosive agent consisting of a thiol group-containing alkanethiol-based compound.

2. The back sheet for a solar cell module according to claim 1, wherein the heat-dissipating metal layer is a metal film comprising one or more metal selected from the group consisting of aluminum, gold, silver, copper, nickel, tin, zinc, tungsten and iron.

3. The back sheet for a solar cell module according to claim 1, wherein the surface layer comprises a polyethylene based film layer or a fluorine coating layer.

4. The back sheet for a solar cell module according to claim 3, wherein the polyethylene based film layer comprises a white inorganic material.

5. The back sheet for a solar cell module according to claim 4, wherein the white inorganic material comprises titanium dioxide.

6. The back sheet for a solar cell module according to claim 3, wherein the polyethylene film layer comprises a white inorganic material and has a thickness of 50-300 μm.

7. The back sheet for a solar cell module according to claim 3, wherein the fluorine coating layer comprises an ethylene-containing fluorine resin.

8. The back sheet for a solar cell module according to claim 3, wherein the fluorine coating layer has a thickness of 5-30 μm.

9. The back sheet for a solar cell module according to claim 3, wherein the surface layer is the fluorine coating layer and the back sheet further comprises a primer layer formed on the fluorine coating layer opposite the upper anticorrosion layer.

10. The back sheet for a solar cell module according to claim 1, wherein the back sheet further comprises a fluorine coating layer formed on the lower anticorrosion layer opposite the heat dissipating metal layer.

11. The back sheet for a solar cell module according to claim 10, wherein the fluorine coating layer comprises one or more fluorine resin selected from the group consisting of polyvinylidene fluoride, polytetrafluoroethylene, perfluoroalkoxy, a copolymer of tetrafluoroethylene and hexafluoropropylene, a copolymer of tetrafluoroethylene and ethylene or propylene, polychlorotrifluoroethylene, and polyvinyl fluoride.

12. The back sheet for a solar cell module according to claim 1, wherein the back sheet further comprises a heat-dissipating ink coating layer formed on the lower anticorrosion layer opposite the heat dissipating metal layer.

13. The back sheet for a solar cell module according to claim 12, wherein the heat-dissipating ink coating layer comprises a heat-dissipating material and a binder resin.

14. The back sheet for a solar cell module according to claim 13, wherein the heat-dissipating ink coating layer comprises 20-300 parts by weight of the heat-dissipating material based on 100 parts by weight of the binder resin.

15. The back sheet for a solar cell module according to claim 13, wherein the heat-dissipating material is one or more selected from the group consisting of a carbon material and a metal particle.

16. The back sheet for a solar cell module according to claim 15, wherein the carbon material is one or more selected from the group consisting of graphite, graphene, carbon nanotube and carbon nanofiber.

17. The back sheet for a solar cell module according to claim 15, wherein the metal particle is one or more selected from the group consisting of aluminum, gold, silver, copper, nickel, tin, zinc, tungsten and iron.

18. The back sheet for a solar cell module according to claim 12, wherein the back sheet further comprises
 a polyester based film layer formed on the heat-dissipating ink coating layer opposite the lower anticorrosion layer, or
 a fluorine coating layer formed on the heat-dissipating ink coating layer opposite the lower anticorrosion layer.

19. The back sheet for a solar cell module according to claim 12, wherein the back sheet further comprises
 a polyester based film layer formed on the heat-dissipating ink coating layer opposite the lower anticorrosion layer; and
 a fluorine coating layer formed on the polyester based film layer opposite the heat-dissipating ink coating layer.

20. A solar cell module comprising the back sheet for a solar cell module according to claim 1.

* * * * *